(12) United States Patent
Heydt et al.

(10) Patent No.: US 7,197,410 B2
(45) Date of Patent: Mar. 27, 2007

(54) PREDICTING LOSS OF FREQUENCY LOCK BETWEEN A MOTOR CONTROL CIRCUIT AND A MOTOR

(75) Inventors: Jeffrey Alan Heydt, Longmont, CO (US); David Ray Street, Allen, TX (US)

(73) Assignee: Seagate Technology LLC, Scotts Valley, CA (US)

( * ) Notice: Subject to any disclaimer, the term of this patent is extended or adjusted under 35 U.S.C. 154(b) by 49 days.

(21) Appl. No.: 10/910,993

(22) Filed: Aug. 4, 2004

(65) Prior Publication Data

US 2006/0031034 A1 Feb. 9, 2006

(51) Int. Cl.
*G01R 15/00* (2006.01)
(52) U.S. Cl. .................... 702/57; 702/75; 318/807; 318/810
(58) Field of Classification Search ............ 702/57, 702/75; 318/807, 810
See application file for complete search history.

(56) References Cited

U.S. PATENT DOCUMENTS

| | | | |
|---|---|---|---|
| 4,731,572 A * | 3/1988 | Bolie ..................... 318/721 |
| 5,101,417 A * | 3/1992 | Richley et al. ........... 375/147 |
| 5,616,996 A | 4/1997 | Tang et al. |
| 5,631,999 A * | 5/1997 | Dinsmore ................ 388/805 |
| 5,682,334 A | 10/1997 | Plutowski et al. |
| 5,717,298 A | 2/1998 | Tang et al. |
| 5,818,179 A | 10/1998 | Kokami et al. |
| 6,252,362 B1 * | 6/2001 | White et al. ............. 318/254 |
| 6,555,985 B1 | 4/2003 | Kawabata et al. |
| 6,577,088 B2 | 6/2003 | Heydt et al. |
| 6,664,749 B2 | 12/2003 | Heydt et al. |
| 6,710,567 B2 | 3/2004 | Heydt et al. |
| 6,774,601 B2 * | 8/2004 | Schwartz et al. .......... 318/727 |
| 2004/0130287 A1 * | 7/2004 | Sadasivam et al. ........ 318/799 |

* cited by examiner

*Primary Examiner*—Marc S. Hoff
*Assistant Examiner*—Janet L Suglo
(74) *Attorney, Agent, or Firm*—David K. Lucente; Derek J. Berger

(57) ABSTRACT

Method arid apparatus for accelerating a multi-phase motor having a rotatable rotor are disclosed. The method incorporates use of a motor control circuit to predict a subsequent loss of frequency lock between the motor control circuit and a motor while the motor control circuit and the motor remain frequency locked, and based on the prediction, steps to avert a loss of frequency lock during acceleration. The apparatus includes at least a motor control circuit detecting frequency lock wit a motor when a motor signal falls within a timing window, and while frequency locked, predicting a subsequent loss of frequency lock based on a relative position of the motor signal within the timing window

17 Claims, 5 Drawing Sheets

PREDICTING LOSS OF FREQUENCY LOCK BETWEEN A MOTOR CONTROL CIRCUIT AND A MOTOR

FIELD OF THE INVENTION

This invention relates generally to the field of control systems and more particularly, but without limitation, to a method and apparatus for controlling a portion of an acceleration process for a motor.

BACKGROUND

Accelerating a motor can take many steps before achieving a nominal run speed, and depending on the environment, heightened care must be taken during an acceleration of the motor. Control of spindle motors used for spinning discs in a data storage device pose particularly distinct control issues.

Because spindle motors of data storage devices can be operated at velocities of 10K RPM or greater, motor control circuits optimized for operating the spindle motor at the nominal run speed of the spindle motor do not always have the bandwidth to effectively respond to changes in speed of the spindle motor at low speeds. Operating characteristics are very different between 1000 RPM and 10K (or higher) RPM. Such things as the commutation duration, response timing, device-to-device variations in electronics, operating environment including power and temperature differences, and basic physics differences between devices such as inertia and mass play a significant role in how a particular spindle motor accelerates.

While various approaches for compensating variations in motor acceleration during spin up have been proposed, there nevertheless remains a continued need for improvements in the art, and it is to such improvements that the present invention is generally directed.

SUMMARY OF THE INVENTION

In accordance with preferred embodiments, an apparatus and method are provided for averting a loss of frequency lock between a spindle motor and a motor control chip of a motor control circuit during a portion of an acceleration of the motor to a predetermined velocity. The method generally comprises a use of a motor control circuit to predict a subsequent loss of frequency lock between the motor control circuit and a motor while the motor control circuit and the motor remain frequency locked, and based on the prediction, steps to avert a loss of frequency lock during acceleration of the motor.

The apparatus generally comprises a motor control circuit detecting frequency lock with a motor when a motor signal falls within a timing window, and while frequency locked, predicting a subsequent loss of frequency lock based on a relative position of the motor signal within the timing window.

These and various other features and advantages which characterize the claimed invention will be apparent from reading the following detailed description and a review of the associated drawings.

DETAILED DESCRIPTION

For purposes of promoting an enhanced understanding of the present invention, and not by way of imparting any limitations on the present invention, a three phase motor model has been selected as a framework for discussion of the present invention throughout the instant disclosure. During each commutation step of a three phase motor, current is applied to one phase, sunk from another phase, and a third phase is held at a high impedance in an unenergized state. A key to successful and efficient acceleration of a motor is the application of current in the right phase and at the right time. A misapplication of current across the winding, i.e., an out of phase application of current across the windings, either premature or extended, generates negative/reverse torque which retards acceleration and in effect serves as a brake.

Figure 1:
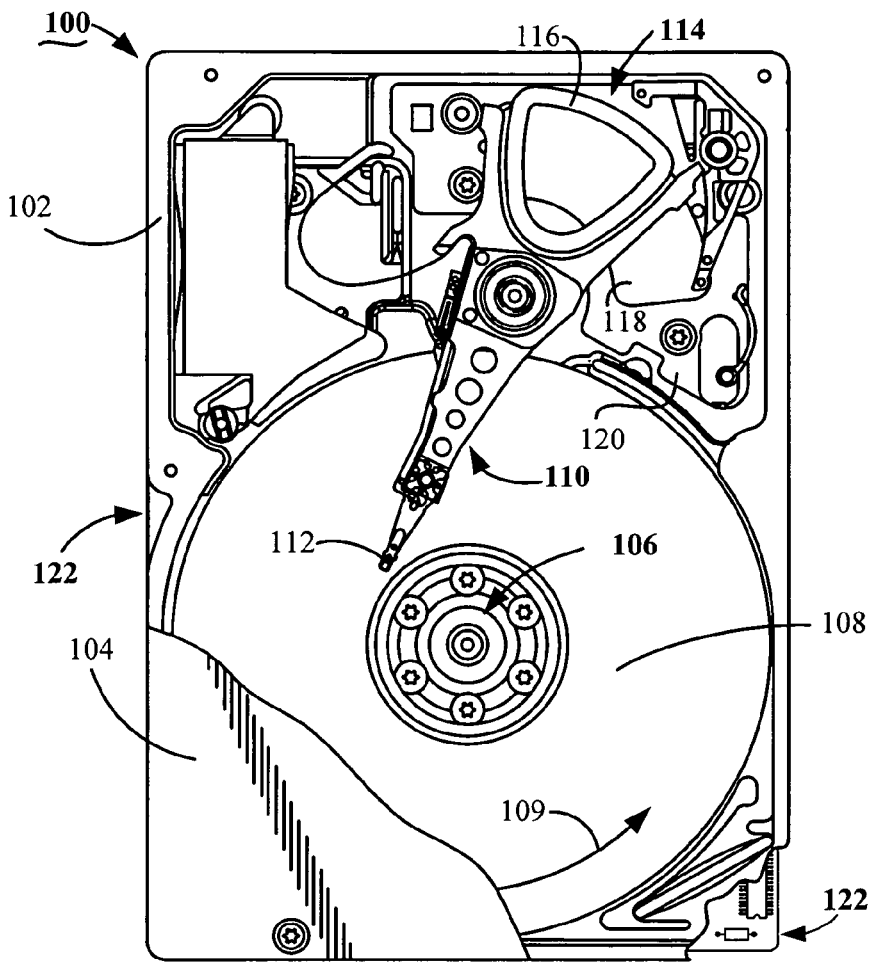
FIG. 1 is a top plan view of a data storage device constructed and operated in accordance with preferred embodiments of the present invention.

Such a model is utilized in a data storage device 100 shown in FIG. 1. The device 100 includes a base deck 102 which cooperates with a top cover 104 (shown in partial cut-away) to form an environmentally controlled housing for the device 100.

A spindle motor 106 (also referred to herein as motor 106) supported within the housing rotates a number of rigid magnetic recording discs (discs) 108 in a rotational direction 109. An actuator 110 supports a corresponding number of heads 112 adjacent tracks (not shown) defined on the disc surfaces. A voice coil motor (VCM) 114 is used to rotate the actuator 110 and hence, move the heads 112 radially across the discs 108.

The VCM 114 includes a moveable actuator coil 116 and a stationary magnetic circuit. The magnetic circuit includes a permanent magnet 118 supported on a magnetically permeable pole piece 120. A second pole piece and a second permanent magnet are normally disposed over the coil to complete the magnetic circuit, but these components have been omitted in FIG. 1 to provide a better view of the actuator coil 116.

Communication and control electronics for the device 100 are supported on a printed circuit board assembly (PCBA) 122 mounted to the underside of the base deck 102.

Figure 2:
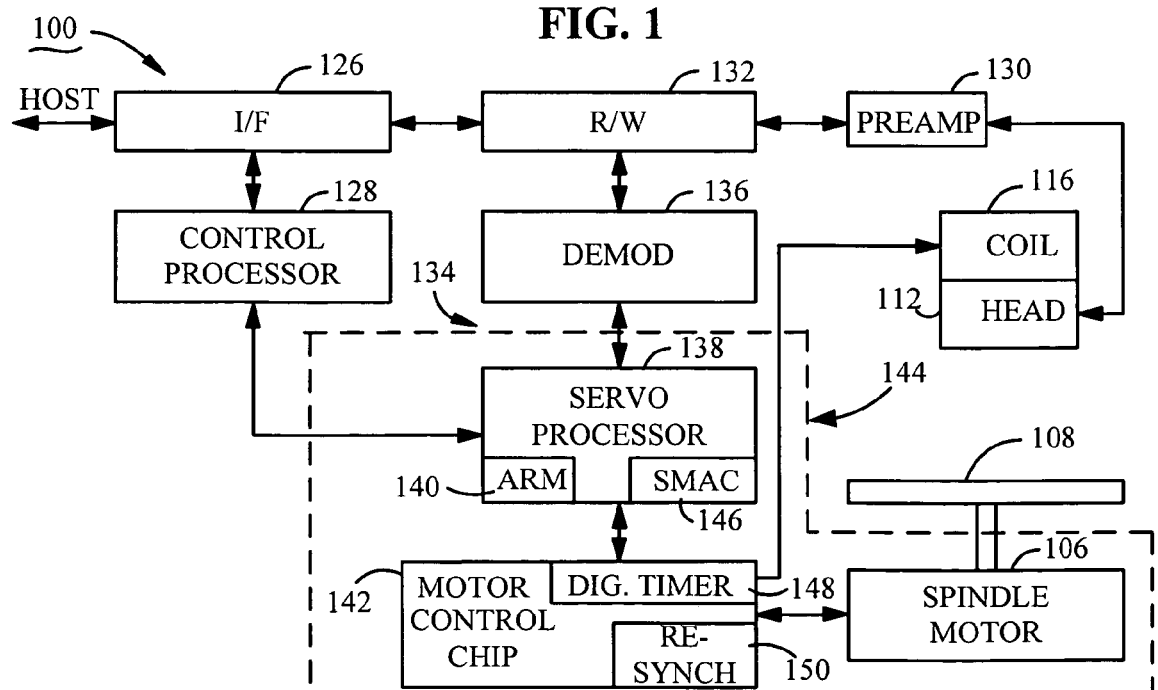
FIG. 2 provides a functional block representation of control circuits of the device of FIG. 1.

FIG. 2 provides a functional block diagram showing control circuitry provided by the PCBA 122 of the device 100 (of FIG. 1). Data and host commands are provided from a host device to the device 100 using interface (I/F) circuitry 126 in conjunction with a top level control processor 128. Data are transferred between the discs 108 and the host device using the read/write head 112, a (preamp) 130, a read/write (R/W) channel 132 and I/F circuitry 126.

Head positional control is provided by a closed-loop servo circuit 134 comprising demodulation (demod) circuitry 136, a servo processor (controller) 138 (preferably comprising an Advanced RISC Machine, or ARM 140) and motor control chip (MCC) 142 communicating with the actuator coil 116 and controls application of activation currents across the actuator coil 116 to rotate the actuator 110.

Spindle motor control is provided by motor control circuitry 144. In addition to the MCC 142, the motor control circuitry 144 comprises the controller 138 with the ARM 140 and a Synchronicity Monitoring and Adjustment Circuit (SMAC) 146 (which may be implemented in either software or hardware form). The MCC 142 includes a digital timer 148 and a resynchronization circuit 150.

The SMAC 146 monitors and adjusts the synchronicity between the MCC 142 and the spindle motor 106 to facilitate an efficient acceleration of the spindle motor 106, by assuring acceleration current is applied in the right phase and at the right time across motor windings of the spindle motor 106.

In a preferred embodiment, while the MCC 142 is in a coast mode, and the spindle motor 106 is coasting (i.e., no current being applied across the motor windings), the MCC 142 automatically synchronizes a selected phase of the MCC 142 with a corresponding selected winding of the motor 106 (i.e., the corresponding phase of the motor 106), to attain frequency locking between the motor 106 and the MCC 142.

To confirm frequency locking between the spindle motor 106 and the MCC 142, the MCC 142 opens a timing window when the MCC 142 expects to detect a zero crossing (ZC) in a back electro motive force (BEMF) signal from windings of the spindle motor 106. If the ZC is detected during the time period that the timing window is open, frequency lock is confirmed. The timing window opening is triggered off a timeout of the digital timer 148, which is set based on previous velocity measurements detected from the BEMF signal. In an alternate embodiment, a phase-locked-loop circuit, or other timing technique may be used in place of the digital timer 148.

During acceleration of the motor 106, if the ZC is detected to be within the detection window, the MCC 142 and the spindle motor 106 are synchronized, and the MCC 142 continues to correctly direct the application of current across the windings for the right phase and at the right time to accelerate the motor. However, if the ZC is not detected to be within the detection window, the spindle motor 106 and the MCC 142 are out of synchronicity and loss of frequency lock has occurred.

The MCC 142 is unable to detect and respond to a condition when frequency lock between the spindle motor 106 and the MCC 142 is lost. The MCC 142 in this situation continues to operate in normal run mode as best as possible. However a loss of frequency lock means that the applied current has been misapplied across the windings thereby retarding acceleration of the spindle motor. The MCC 142 is in effect acting as a brake, and the power consumed for any misapplied periods has been wasted.

To mitigate the loss of frequency lock, the SMAC 146 predicts an oncoming loss of frequency lock (i.e., an out-of-phase condition) between the spindle motor 106 and the MCC 142, and the controller 138 intervenes by altering the current being applied to the motor windings. Direct alteration of the current being applied, and a reduction in applied current through a forced entry of the MCC 142 into a coast mode are two of many forms of current alteration available to the controller 138. A forced entry of the MCC 142 into a coast mode halts current applied to the motor windings and resynchronizes the MCC 142 to the spindle motor 106.

One correction method embodiment involves altering the acceleration of the spindle motor 106 by controlling the amplitude of the current driving the spindle motor 106. In the event that the ZC occurs after the MCC 142's expectation, directly increasing the current will result in more torque and faster acceleration thereby lessening the effects of a loss of frequency lock between the spindle motor 106 and MCC 142. Similarly, in the event the ZC occurs before the MCC 142's expectation, decreasing the current will result in less torque and slower acceleration also lessening the effects of a loss of frequency lock between the spindle motor 106 and MCC 142.

Another correction method embodiment consists of forcing the MCC 142 into the coast mode for resynchronization, based on a predicted loss of frequency lock. Forcing the MCC 142 onto the coast mode eliminates misapplied current, because resynchronization of the spindle motor 106 to the MCC 142 occurs prior to a loss in frequency lock between the spindle motor 106 to the MCC 142.

Figure 3:
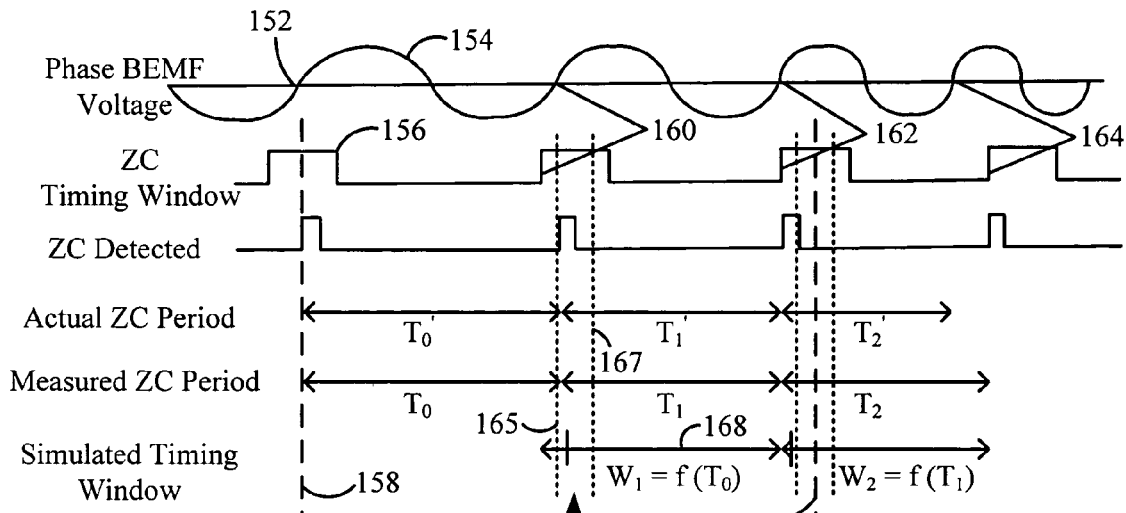
FIG. 3 is a diagram depicting an active acceleration of the spindle motor of FIG. 1.

FIG. 3 shows a plurality of ZCs, such as 152, of a BEMF voltage signal 154 of an accelerating spindle motor 106 (of FIG. 2), as can be seen by the successive reductions in time between occurrences of a ZC 152. During operation of the spindle motor 106 (of FIG. 2), each ZC 152 is used to confirm frequency lock between the spindle motor 106 and the MCC 142 (of FIG. 2), while the MCC 142 is in a coast mode. Frequency lock is confirmed by recognition of the ZC 152 with any timing window such as 156.

Opening of each timing window 156 is timed to correspond with the expected arrival of its corresponding ZC 152. The arrival of each ZC 152 is expected to arrive in substantial alignment with a central position 158 of the timing window 156. The rotational velocity of the spindle motor 106 at any given ZC 152 is used as the basis for predicting the opening of the next timing window 156. When the spindle motor 106 is operating at its operational velocity, the accuracy of the predicted opening time for each timing window 156 is quite high. During acceleration at lower speeds, the large changes and variability in ZC frequency makes predicting the opening time more difficult to calculate.

Because during periods of closure of the timing windows 156 current is being applied to the windings of the spindle motor 106, and due to the dependence on velocity readings of the spindle motor 106 for opening of the timing windows 156, the successive earlier arrivals of the ZCs 152, as shown by the sign numbers 160 and 162, is not an unexpected result. It is also not unexpected that a continual succession of earlier occurrence of ZCs 152 will lead to a loss of frequency lock, such as shown by sign number 164. The MCC 142 operates as a "go no-go" test for frequency lock, that is, either the ZC 152 occurred within the timing window 156, or it did not. The MCC 142 lacks the capability of identifying where within the timing window 156 that a ZC 152 occurred.

By establishing an intervention criteria 166 within a simulated timing interval 168, which corresponds to a timing window 156, and by defining an effective center 170 of the intervention criteria 166 aligned in time with the central position 158 of the timing window 156, the amount of separation in time between the occurrence of the ZC 152 relative to the effective center 170 can be monitored by the SMAC 146. The intervention criteria 166 can also be characterized as a second timing window within each first timing window 156 as depicted in FIG. 3.

Upon an occurrence of the ZC 152 falling outside of the intervention criteria 166, while remaining within the timing window 156, the SMAC 146 responds by adjusting the current applied to the windings of the motor 106. The SMAC 146 adjusts the current to the windings by either a direct adjustment of the current being supplied, or by placing the MCC 142 into its coast mode. It is noted that each of the boundaries, 165 and 167, of the intervention criteria 166 are empirically determined for each type of data storage device.

Figure 4:
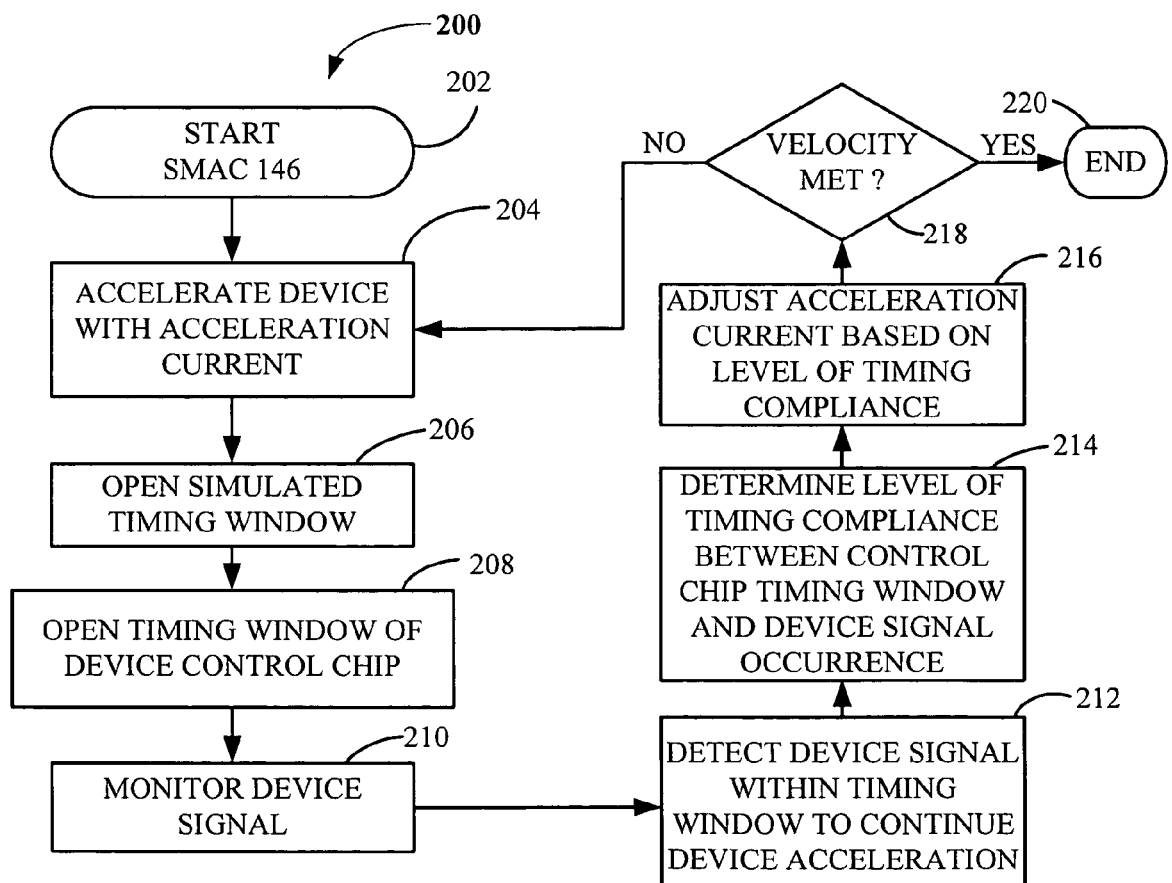
FIG. 4 is a flowchart showing a method for maintaining frequency lock between the spindle motor and its motor control chip during acceleration of the motor.

FIG. 4 shows a flowchart 200 of an acceleration process for accelerating a device to a predetermined velocity. The process commences at process step 202 with the activation of a Synchronicity Monitoring and Adjustment Circuit (such as SMAC 146), and continues at process step 204 with an application of current for acceleration of a device (such as spindle motor 106). At process step 206, a controller (such as 138) derives and opens a simulated timing interval (such as 168) for use as a basis in determining a deviation in time between a ZC event (such as 152) and a central position (such as 158), of a timing window (such as 156), of a device control chip (such as MCC 142). At process step 208, the timing window of the device control chip is opened for use in detecting a frequency lock between the device control chip and the device. With the timing window opened, the device control chip monitors for an occurrence of a device signal (such as ZC 152) at process step 210.

At process step 212, a detection of the device signal within the timing window permits continuance of the acceleration of the device. At process step 214, a level of timing compliance between the central position of the timing window and an occurrence of the device signal is determined. At process step 216, adjustments to the current driving the acceleration of the device are made based on the level of timing compliance determined by process step 214. At process step 218, a determination of whether or not a predetermined velocity for the device has been met. If the predetermined velocity for the device has been met, the process concludes at end process step 220. However, if the predetermined velocity for the device has not been met, the process reverts to process step 204 and continues until the predetermined velocity has been met.

Figure 5:
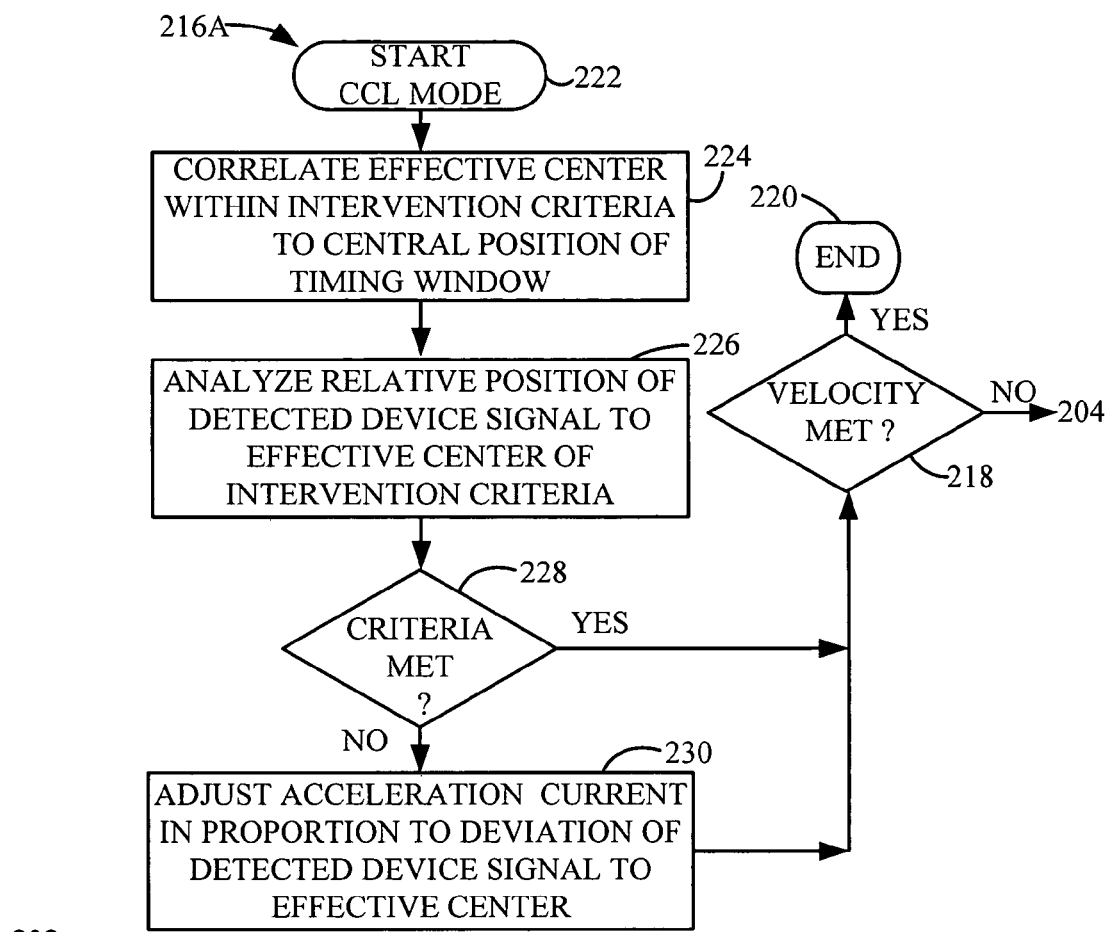
FIG. 5 is a flowchart showing a current controlled locking (CCL) mode for use within the method of FIG. 4.

FIG. 5 shows a flowchart 216A, which is an embodiment of a method for adjusting the current driving the acceleration of the device (such as spindle motor 106) called for by process step 216 of the acceleration process flowchart 200 (of FIG. 4). The embodiment for adjusting the current driving acceleration of the device shown by flowchart 216A is referred to as a current controlled locking mode (CCL mode). When operating under the CCL mode, a synchronicity monitoring and adjustment circuit (SMAC) (such as SMAC 146 of FIG. 4) is activated by a controller (such as 138) at process step 222 with the commencement of the CCL mode. The process continues at process step 224 with a correlation of and effective center (such as 170) of an intervention criteria (such as 166) and a central position (such as 158) of a timing window (such as 156). At process step 226, the controller operating the SMAC analyzes the relative position of a device signal (such as ZC 152) to the effective center of the intervention criteria.

At process step 228, a determination of whether or not the device falls within the intervention criteria is made. If the timing of the device signal falls within the intervention criteria, the process proceeds to process step 218 with the verification of whether or not the device has attained a predetermined velocity. If the device has attained the predetermined velocity, the process concludes at end step 220. If the device has not attained the predetermined velocity, the process reverts to process step 204 (of FIG. 4), and continues until attainment of the predetermined velocity.

However, if at process step 228 the intervention criteria has not been met and the timing of the occurrence of the device signal falls outside of the intervention criteria, the process proceeds to process step 230. At process step 230, the current driving the device is adjusted by a control function, responding to the deviation of the timing of the device signal relative to the effective center of the intervention criteria, and then continues to process step 218 for the conclusion of the process.

Figure 6:
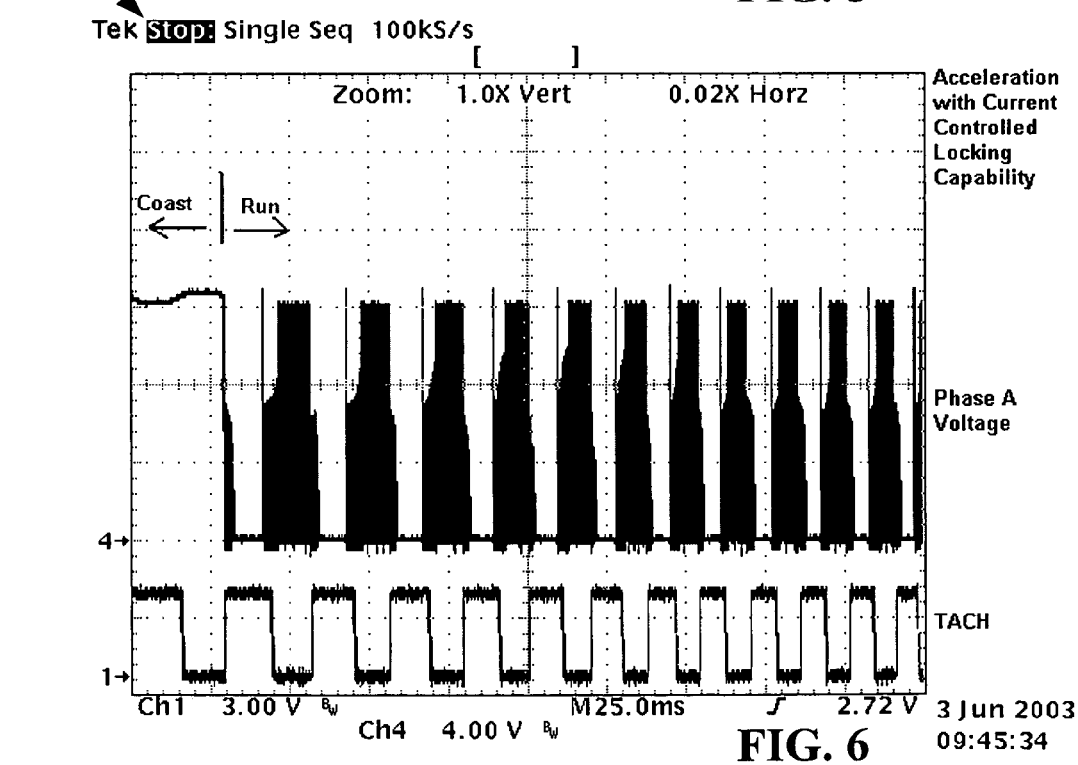
FIG. 6 is graphical representation of a response of the spindle motor of FIG. 1 operating under the current controlled locking mode of FIG. 5.

FIG. 6 shows a graphical print out 232 of the active response of the spindle motor 106 (of FIG. 2) to the application of the process steps described by the flowchart of FIG. 5.

Figure 7:
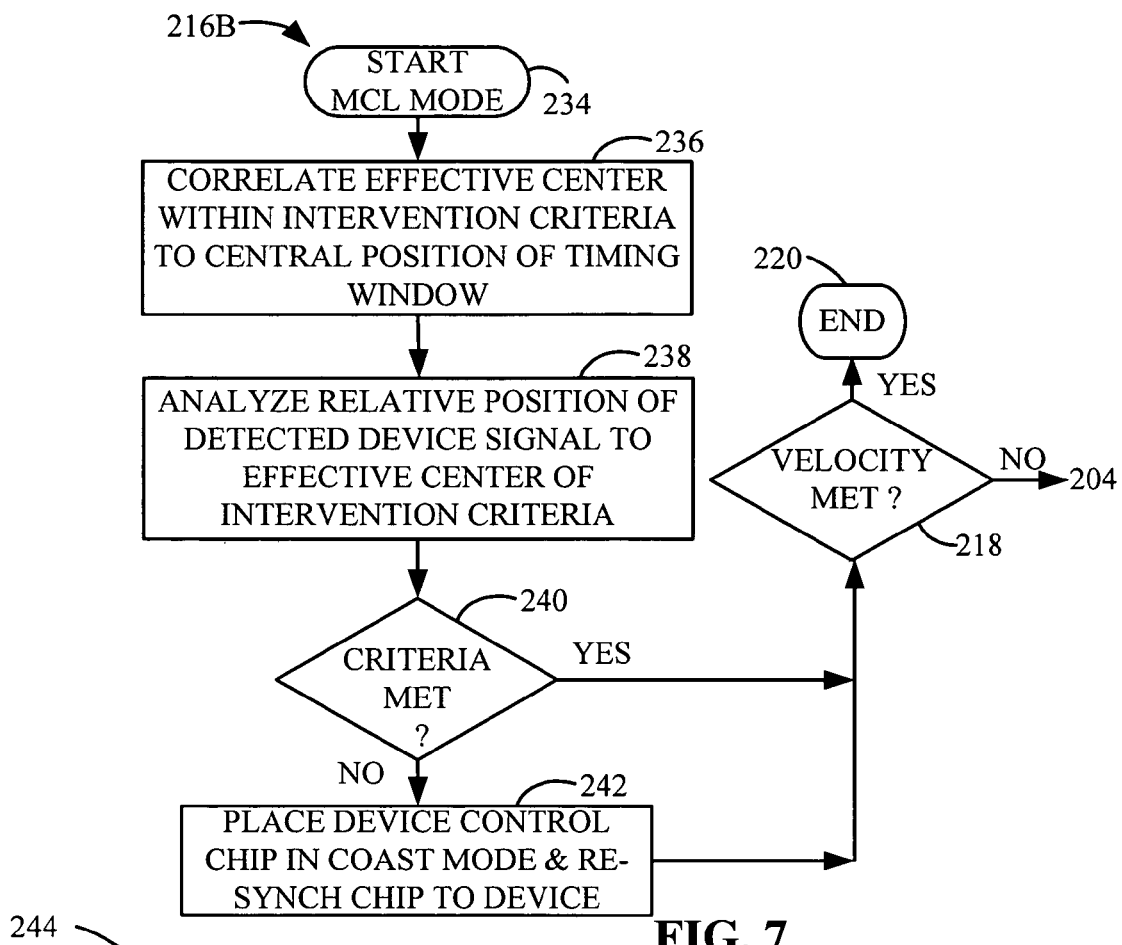
FIG. 7 is a flowchart showing a mode controlled locking (MCL) mode for use within the method of FIG. 4.

FIG. 7 shows a flowchart 216B, which is an preferred embodiment of a method for adjusting the current driving the acceleration of the device (such as spindle motor 106) called for by process step 216 of the acceleration process flowchart 200 (of FIG. 4). The preferred embodiment method for adjusting the current driving acceleration of the device shown by flowchart 216B is referred to as a mode controlled locking mode (MCL mode). When operating under the MCL mode, a synchronicity monitoring and adjustment circuit (SMAC) (such as SMAC 146 of FIG. 4) is activated by a controller (such as 138) at process step 234 with the commencement of the MCL mode. The process continues at process step 236 with a correlation of and effective center (such as 170) of an intervention criteria (such as 166) and a central position (such as 158) of a timing window (such as 156). At process step 238, the controller operating the SMAC analyzes the relative position of a device signal (such as ZC 152) to the effective center of the intervention criteria.

At process step 240, a determination of whether or not the device falls within the intervention criteria is made. If the timing of the device signal falls within the intervention criteria, the process proceeds to process step 218 with the verification of whether or not the device has attained a predetermined velocity. If the device has attained the predetermined velocity, the process concludes at end step 220. If the device has not attained the predetermined velocity, the process reverts to process step 204 (of FIG. 4), and continues until attainment of the predetermined velocity.

However, if at process step 240 the intervention criteria has not been met and the timing of the occurrence of the device signal falls outside of the intervention criteria, the process proceeds to process step 242. At process step 242, the controller places a device control chip (such as MCC 142) into a coast mode, and activates a resynchronization circuit (such as 150), which resynchronizes the device with the control chip, thereby reestablishing a more precise frequency lock between the device and the control chip, prior to a loss of frequency locking between the control chip and the device. Following the reestablishment of a more precise frequency lock between the device and the control chip, the controller returns the control chip to a run mode, and then proceeds to process step 218 for the conclusion of the process.

Figure 8:
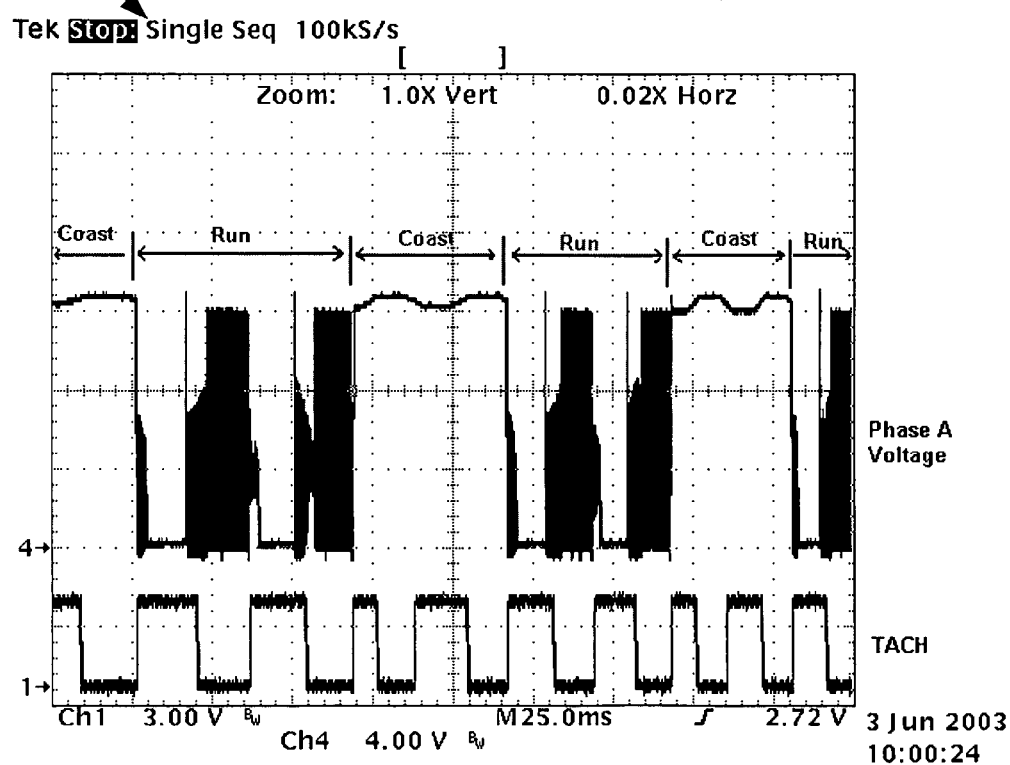
FIG. 8 is a graphical representation of a response of the spindle motor of FIG. 1 operating under the mode controlled locking mode of FIG. 7.

FIG. 8 shows a graphical print out 244 of the active response of the spindle motor 106 (of FIG. 2) to the application of the process steps described by the flowchart of FIG. 7.

Figure 9:
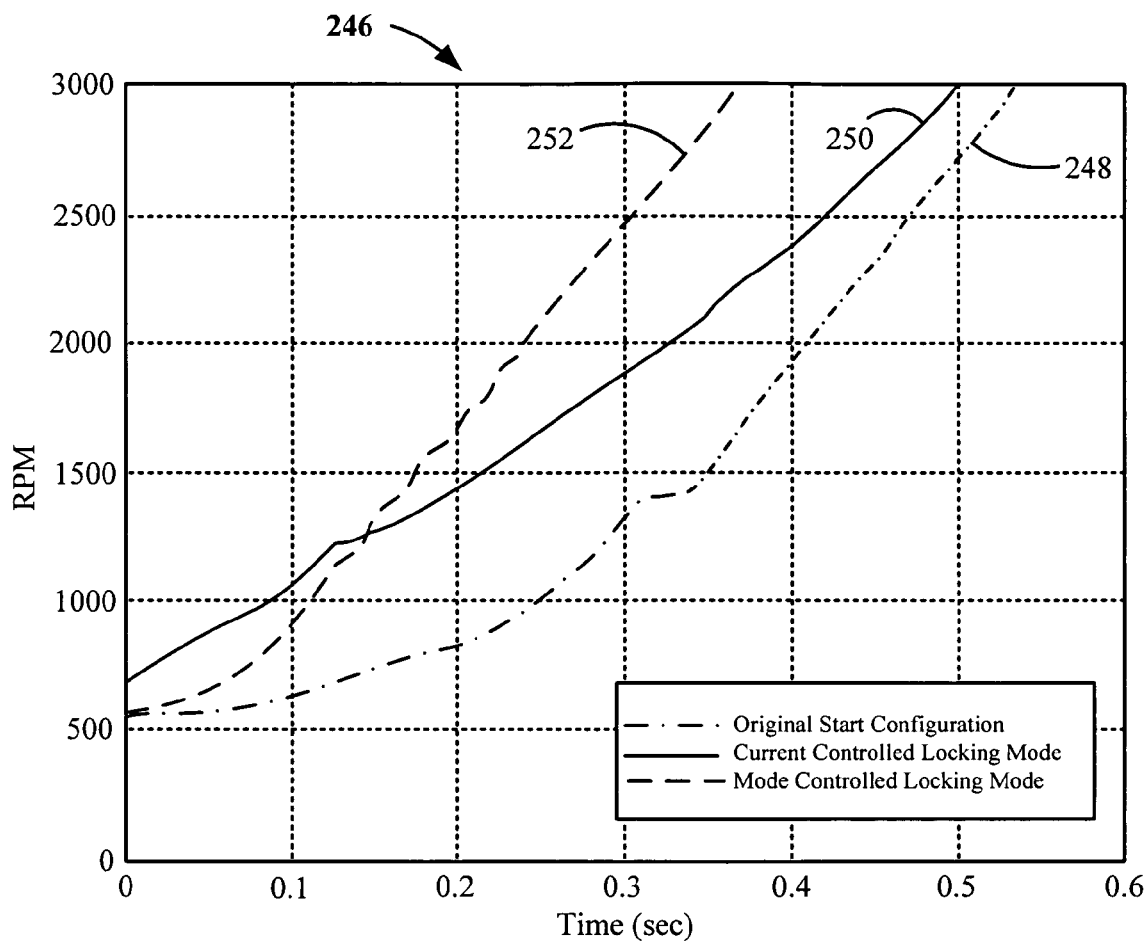
FIG. 9 is a graphical representation of a comparison of the acceleration of the spindle motor of FIG. 1 when operated under the CCL mode of FIG. 5, the MCL mode of FIG. 7, and no locking control mode.
Figure 10:
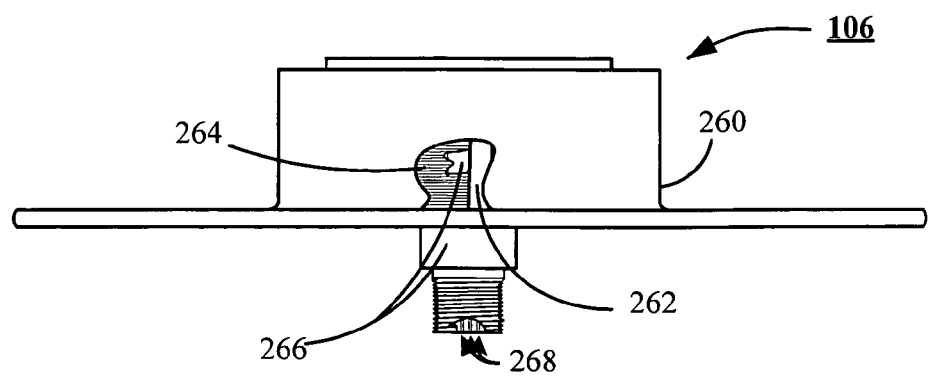
FIG. 10 is a partial cut-away elevational view of the spindle motor of FIG. 1.

FIG. 9 shows a comparison graph 246, comparing differences between; an original acceleration curve 248, for a spindle motor (such as 106 of FIG. 2) operating under an application of a maximum allowable current specified for the spindle motor; a CCL acceleration curve 250 for the same spindle motor, but incorporating the use of the current controlled locking (CCL) mode, and operating in accordance with the flowcharts shown by FIGS. 4 and 5; and a MCL acceleration curve 252 for the same spindle motor operating under the use of the mode controlled locking (MCL) mode, and in accordance with the flowcharts shown by FIGS. 4 and 7. Although significant performance improvements are realized through the adaptation of the CCL mode (as shown by acceleration curve 250), even greater performance improvements are realized through the adaptation of the MCL mode (as shown by MCL acceleration curve 252). The spindle motor 106 shown by FIG. 10 is a preferred embodiment that includes a rotor hub 260 (also referred to as rotor 260) supporting a plurality of permanent magnets (one shown at 262). The permanent magnets 262 are adjacent three motor windings 264 supported by a stator shaft 266. The stator shaft 266, confines motor contacts A, B, and C 268, for locating the rotor 260 and operating the spindle motor 106.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising predicting a subsequent loss of frequency lock between a motor control circuit and a motor while the motor control circuit and the motor remain frequency locked, and adjusting a current applied to the motor in response to the predicting step.

2. The method of claim 1, in which the subsequent loss of frequency lock is predicted by steps comprising:
   detecting frequency lock between the motor control circuit and the motor when a motor signal falls within a first timing window; and
   predicting the subsequent loss of frequency lock when the motor signal falls outside of a second timing window while falling within the first timing window.

3. The method of claim 2, farther comprising the steps of:
   halting application of current to the motor upon predicting the subsequent loss of frequency lock;
   entering a coast mode of a motor control chip of the motor control circuit from a run mode;
   frequency locking the motor to the motor control chip during the coast mode; and re-applying current to the motor by re-entering the run mode.

4. The method of claim 3, in which the current re-applied to the motor is a maximum allowable current specified for the motor.

5. The method of claim 2, further comprising the steps of:
   defining an effective center of the second timing window aligned in time with a central position of the first timing window;
   determining a level of time discrepancy between the effective center of the second timing window and a timing of the motor signal falling outside the second timing window; and
   applying current to the motor based on said level of time discrepancy.

6. The method of claim 5, further comprises a step of applying a maximum allowable current to the motor prior to detecting frequency lock, and in which the current applied to the motor comprises reducing the current driving the motor from the maximum allowable current when the timing of the motor signal occurs prior to a timing of occurrence of the effective center of the second timing window.

7. The method of claim 5, further comprises a step of applying a maximum allowable current to the motor prior to detecting frequency lock, and in which the current applied to the motor comprises increasing a duration for applying the maximum allowable current to the motor when the timing of the motor signal occurs subsequent to a timing of occurrence of the effective center of the second timing window.

8. The method of claim 2, further comprising:
   establishing frequency lock between the motor and the motor control circuit by operating a motor control chip of the motor control circuit in a coast mode; and
   switching the motor control chip to a run mode subsequent to establishment of said frequency lock.

9. The method of claim 1, wherein the predicting step is carried out by the motor control circuit.

10. An apparatus comprising a motor control circuit detecting frequency lock with a motor when a motor signal falls within a timing window, and while frequency locked, predicting a subsequent loss of frequency lock based on a relative position of the motor signal within the timing window.

11. The apparatus of claim 10, in which the motor control circuit comprises:
    a controller with a synchronicity monitoring and adjustment circuit activated upon loss of frequency lock; and
    a motor control chip responsive to the controller applying current across windings of the motor when the motor and the motor control chip are frequency locked, and halting the application of current across the windings when frequency lock is lost.

12. The apparatus of claim 11, in which the motor provides the motor signal based on an occurrence of a zero crossing event of a back electromotive force voltage from a winding of the motor, and in which upon loss of frequency lock the motor control circuit places the motor control chip into a coast mode which places the motor in a coast mode, and wherein the motor control chip comprises:
    a digital timer clocking an opening of the timing window, the timing window defining a time period for detecting the motor signal; and
    a resynchronization circuit responsive to activation of the synchronicity monitoring and adjustment circuit automatically restoring frequency lock between the motor control chip and the motor during the coast mode.

13. The apparatus of claim 12, in which the controller returns the motor control chip to a run mode upon restoration of frequency lock between the motor control chip and the motor.

14. The apparatus of claim 10, wherein the timing window is characterized as a first timing window, and wherein the motor control circuit predicts the loss of frequency lock when the motor circuit falls outside of a smaller second timing window within the first timing window.

15. A method comprising steps of detecting frequency lock of a motor when a motor signal falls within a timing window, predicting a subsequent loss of frequency lock based on a relative position of the motor signal within the timing window while the motor remains frequency locked, and adjusting a motor current in response to the predicting step.

16. The method of claim 15, wherein the timing window is characterized as a first timing window, and wherein the predicting step comprises predicting the subsequent loss of frequency lock when the motor signal falls outside of a second timing window while falling within the first timing window.

17. The method of claim 15, further comprising a step of temporarily halting application of current to the motor so that the motor enters a coast mode of operation in response to the predicting step.

* * * * *